(12) United States Patent
Wu et al.

(10) Patent No.: US 8,821,962 B2
(45) Date of Patent: Sep. 2, 2014

(54) METHOD OF FORMING DIELECTRIC LAYER WITH A DIELECTRIC COMPOSITION

(75) Inventors: Yiliang Wu, Oakville (CA); Yulin Wang, Oakville (CA); Ping Liu, Mississauga (CA); Nan-Xing Hu, Oakville (CA); Anthony James Wigglesworth, Oakville (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 12/957,461

(22) Filed: Dec. 1, 2010

(65) Prior Publication Data

US 2012/0141757 A1 Jun. 7, 2012

(51) Int. Cl.
*B05D 5/12* (2006.01)
*B05D 3/02* (2006.01)
*H01L 51/05* (2006.01)
*H01L 51/00* (2006.01)

(52) U.S. Cl.
CPC .......... *H01L 51/052* (2013.01); *H01L 51/0545* (2013.01); *H01L 51/0097* (2013.01); *H01L 51/0036* (2013.01); *H01L 51/0541* (2013.01); *H01L 51/0537* (2013.01)
USPC .......... 427/58; 427/384; 427/385.5; 427/387

(58) Field of Classification Search
USPC .......................................... 427/58, 384–387
See application file for complete search history.

(56) References Cited

U.S. PATENT DOCUMENTS

| | | | | |
|---|---|---|---|---|
| 4,707,517 | A * | 11/1987 | Bullen et al. | 525/72 |
| 5,079,300 | A * | 1/1992 | Dubrow et al. | 525/106 |
| 6,113,988 | A * | 9/2000 | Borgholte et al. | 427/407.1 |
| 6,440,642 | B1 * | 8/2002 | Shelnut et al. | 430/315 |
| 2005/0208779 | A1 * | 9/2005 | Klauk et al. | 438/795 |
| 2005/0244662 | A1 * | 11/2005 | Horn et al. | 428/469 |
| 2007/0244279 | A1 * | 10/2007 | Jiang et al. | 526/206 |
| 2009/0234056 | A1 * | 9/2009 | Wu et al. | 524/376 |

FOREIGN PATENT DOCUMENTS

JP 01-108254 * 4/1989

* cited by examiner

*Primary Examiner* — Brian K Talbot
(74) *Attorney, Agent, or Firm* — Fay Sharpe LLP (57) ABSTRACT

An electronic device, such as a thin-film transistor, includes a substrate and a dielectric layer formed from a dielectric composition. The dielectric composition comprises a dielectric material and a low surface tension additive. The low surface tension additive allows for the formation of a thin, smooth dielectric layer with fewer pinholes and enhanced device yield. In particular embodiments, the dielectric material comprises a lower-k dielectric material and a higher-k dielectric material. When deposited, the lower-k dielectric material and the higher-k dielectric material form separate phases.

9 Claims, 5 Drawing Sheets

METHOD OF FORMING DIELECTRIC LAYER WITH A DIELECTRIC COMPOSITION

BACKGROUND

The present disclosure relates, in various embodiments, to thin-film transistors (TFTs) and/or other electronic devices comprising a dielectric layer. The dielectric layer is formed from a dielectric composition as described herein that includes a low surface tension additive. This allows the final dielectric layer to be thinner and smoother with fewer pinholes.

TFTs are generally composed of, on a substrate, an electrically conductive gate electrode, source and drain electrodes, an electrically insulating gate dielectric layer which separate the gate electrode from the source and drain electrodes, and a semiconducting layer which is in contact with the gate dielectric layer and bridges the source and drain electrodes. Their performance can be determined by the field effect mobility and the current on/off ratio of the overall transistor. High mobility and high on/off ratio are desired.

Organic thin-film transistors (OTFTs) can be used in applications such as radio frequency identification (RFID) tags and backplane switching circuits for displays, such as signage, readers, and liquid crystal displays, where high switching speeds and/or high density are not essential. They also have attractive mechanical properties such as being physically compact, lightweight, and flexible.

Organic thin-film transistors can be fabricated using low-cost solution-based patterning and deposition techniques, such as spin coating, solution casting, dip coating, stencil/screen printing, flexography, gravure, offset printing, ink jet-printing, micro-contact printing, and the like, or a combination of these processes. Such processes are generally simpler and more cost effective compared to the complex photolithographic processes used in fabricating silicon-based thin-film transistor circuits for electronic devices. To enable the use of these solution-based processes in fabricating thin-film transistor circuits, solution processable materials are therefore required.

In this regard, gate dielectric layers may be formed by these solution-based processes. However, the gate dielectric layer so formed should be free of pinholes and possess low surface roughness (or high surface smoothness), low leakage current, a high dielectric constant, a high breakdown voltage, adhere well to the gate electrode, be stable in solution at room temperature, and offer other functionality. It should also be compatible with semiconductor materials because the interface between the dielectric layer and the organic semiconductor layer critically affects the performance of the TFT.

It would be desirable to provide a dielectric layer that could be thin, smooth, and pinhole free. Dielectric compositions for producing the same would also be desirable.

BRIEF DESCRIPTION

Disclosed in embodiments are electronic devices and processes for making such electronic devices. Generally, the dielectric layer is formed from a dielectric composition as described herein that includes a low surface tension additive. This composition allows the resulting dielectric layer to be thinner and smoother while remaining pinhole free. The electronic device comprises a dielectric layer formed from such a dielectric composition. In embodiments, the electronic devices are thin-film transistors, particularly thin-film transistors on a flexible substrate, such as low-cost polyethylene terephthalate (PET).

Disclosed in embodiments is a process for fabricating an electronic device. A dielectric composition is deposited on a substrate. The dielectric composition comprises a dielectric material and a low surface tension additive. The dielectric composition is optionally heated to cure it, forming a dielectric layer on the substrate. A semiconductor layer may also be formed on the substrate.

The low surface tension additive may be present in an amount of from about 0.0001 to about 3.0 wt % of the dielectric material.

The low surface tension additive may be selected from the group consisting of a modified polysiloxane, a fluorocarbon modified polymer, and an acrylate copolymer. In some embodiments, the modified polysiloxane is a polyether modified acrylic functional polysiloxane, a polyether-polyester modified hydroxyl functional polysiloxane, or a polyacrylate modified hydroxyl functional polysiloxane.

The low surface tension additive may comprise a hydroxyl functional group and a siloxane functional group.

The dielectric composition may further comprise a crosslinking agent.

In some embodiments, the dielectric material comprises a lower-k dielectric material and a higher-k dielectric material. The lower-k dielectric material may have a dielectric constant of less than 4.0. The higher-k dielectric material may have a dielectric constant of 4.0 or higher. In particular embodiments, the lower-k dielectric material is poly(methyl silsesquioxane) and the higher-k dielectric material is poly(vinylphenol). In others, the lower-k dielectric material is selected from the group consisting of polystyrenes, polysiloxanes, polysilsesquioxanes, polyphenylene, poly(1,3-butadiene), poly(α-vinylnaphthalene), polypropylene, polyisoprene, polyisobutylene, polyethylene, poly(4-methyl-1-pentene), poly(p-xylene), poly(cyclohexyl methacrylate), poly(propylmethacrylPOSS-co-methylmethacrylate), poly(propylmethacrylPOSS-co-styrene), poly(styrylPOSS-co-styrene), and poly(vinyl cinnamate); poly(methyl silsesquioxane) and the higher-k dielectric material is poly(vinylphenol) selected from the group consisting of a polyimide, a polyester, a polyether, a polyacrylate, a polyvinyl, a polyketone, a polysulfone, and a molecular glass compound.

The dielectric composition may further comprise a thermal acid generator or a photo acid generator.

The dielectric layer may have a thickness of from about 10 nm to about 1000 nm. This thickness is much lower than comparable prior art dielectric layers. The dielectric layer may also have a surface roughness of less than 10 nm.

Also disclosed in embodiments is a dielectric composition comprising a dielectric material and a low surface tension additive, wherein the additive reduces the pinhole density and the surface roughness of a dielectric layer formed from the dielectric material.

The low surface tension additive may be selected from the group consisting of a modified polysiloxane, a fluorocarbon modified polymer, and an acrylate polymer. In some embodiments, the modified polysiloxane is a polyether modified acrylic functional polysiloxane, a polyether-polyester modified hydroxyl functional polysiloxane, or a polyacrylate modified hydroxyl functional polysiloxane.

The dielectric composition may further comprise a crosslinking agent.

The dielectric material may comprise a lower-k dielectric material and a higher-k dielectric material, and wherein both the lower-k dielectric material and the higher-k dielectric material are miscible in a common solvent. In some embodiments, the lower-k dielectric material is poly(methyl silsesquioxane) and the higher-k dielectric material is poly(vinylphenol).

Disclosed in other embodiments are electronic devices comprising a dielectric layer. The dielectric layer has a thickness of less than 1000 nm and comprises a low surface tension additive and a dielectric material. The low surface tension additive is present in an amount of from about 0.0001 to about 1.0 wt % of the dielectric material.

These and other non-limiting characteristics of the disclosure are more particularly disclosed below.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The following is a brief description of the drawings, which are presented for the purposes of illustrating the exemplary embodiments disclosed herein and not for the purposes of limiting the same.

DETAILED DESCRIPTION

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range of "from about 2 to about 10" also discloses the range "from 2 to 10."

The term "comprising" is used herein as requiring the presence of the named component and allowing the presence of other components. The term "comprising" should be construed to include the term "consisting of", which allows the presence of only the named component, along with any impurities that might result from the manufacture of the named component.

The term "room temperature" refers to a temperature of from 20° C. to 25° C.

Figure 1:
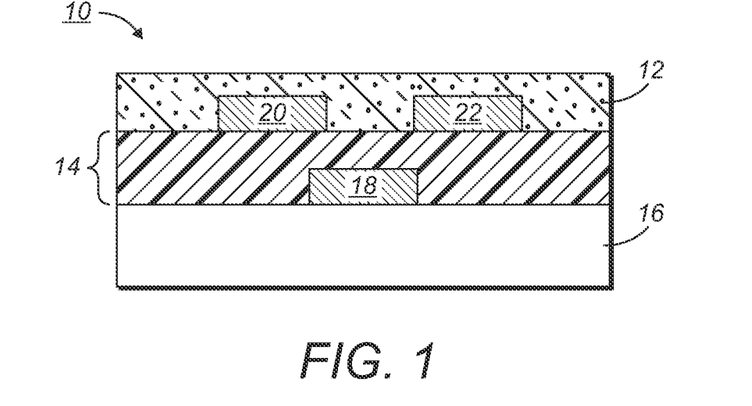
FIG. 1 represents a first embodiment of a TFT according to the present disclosure.

FIG. 1 illustrates a bottom-gate bottom-contact TFT configuration according to the present disclosure. The TFT 10 comprises a substrate 16 in contact with the gate electrode 18 and a gate dielectric layer 14. The gate electrode 18 is depicted here atop the substrate 16, but the gate electrode could also be located in a depression within the substrate. It is important that the gate dielectric layer 14 separates the gate electrode 18 from the source electrode 20, drain electrode 22, and the semiconducting layer 12. The semiconducting layer 12 runs over and between the source and drain electrodes 20 and 22. The semiconductor has a channel length between the source and drain electrodes 20 and 22.

Figure 2:
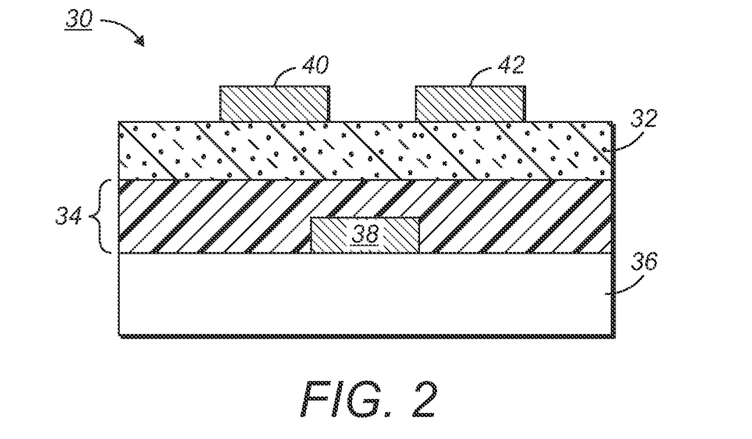
FIG. 2 represents a second embodiment of a TFT according to the present disclosure.

FIG. 2 illustrates another bottom-gate top-contact TFT configuration according to the present disclosure. The TFT 30 comprises a substrate 36 in contact with the gate electrode 38 and a gate dielectric layer 34. The semiconducting layer 32 is placed on top of the gate dielectric layer 34 and separates it from the source and drain electrodes 40 and 42.

Figure 3:
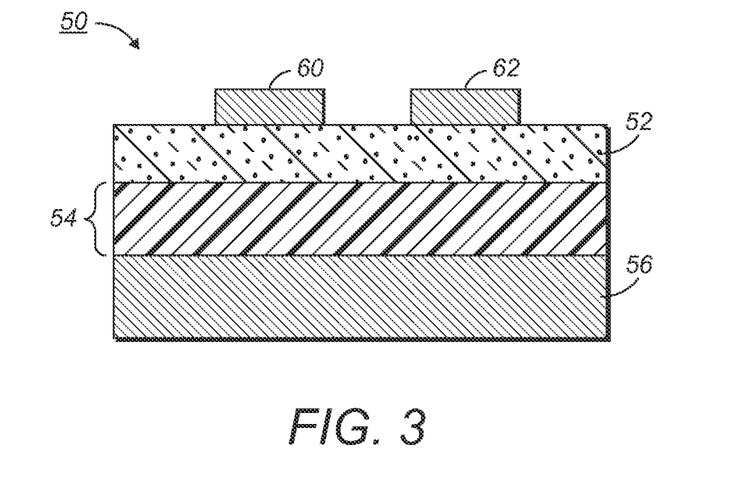
FIG. 3 represents a third embodiment of a TFT according to the present disclosure.

FIG. 3 illustrates a bottom-gate bottom-contact TFT configuration according to the present disclosure. The TFT 50 comprises a substrate 56 which also acts as the gate electrode and is in contact with a gate dielectric layer 54. The source electrode 60, drain electrode 62, and semiconducting layer 52 are located atop the gate dielectric layer 54.

Figure 4:
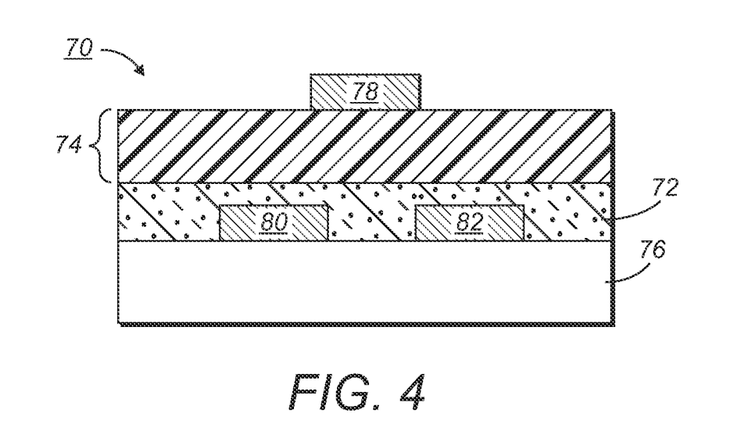
FIG. 4 represents a fourth embodiment of a TFT according to the present disclosure.

FIG. 4 illustrates a top-gate top-contact TFT configuration according to the present disclosure. The TFT 70 comprises a substrate 76 in contact with the source electrode 80, drain electrode 82, and the semiconducting layer 72. The semiconducting layer 72 runs over and between the source and drain electrodes 80 and 82. The gate dielectric layer 74 is on top of the semiconducting layer 72. The gate electrode 78 is on top of the gate dielectric layer 74 and does not contact the semiconducting layer 72.

Aspects of the present disclosure relate to an electronic device (e.g., a thin-film transistor) comprising a dielectric layer, the dielectric layer comprising a low surface tension additive. In some embodiments, the dielectric layer is a single homogeneous layer, or in other words is not composed if multiple phase-separated materials. Further aspects of the present disclosure relate to an electronic device comprising a phase-separated dielectric structure, the dielectric structure comprising a low surface tension additive. In the context of a thin-film transistor, the dielectric structure can also be referred to as a "gate dielectric". The dielectric layer (phase-separated or homogeneous structures) can be used in any suitable electronic device. Besides a thin-film transistor, other types of suitable electronic devices include, for example, an embedded capacitor and an electroluminescent lamp.

A thin and smooth, yet pinhole free, dielectric layer is generally preferred. In many applications, sufficient on current ($I_d$) of a transistor is required for circuit design. One way to increase the current is to use a semiconductor having a high field-effect mobility ($\mu$). Another way is to increase the capacitance ($C_i$) of the dielectric layer. The capacitance $C_i$ is proportional to the dielectric constant $\in$ and inversely proportional to the thickness d of the dielectric layer. Reducing the dielectric layer thickness should increase capacitance and thus the on current. However, decreasing the dielectric layer thickness also increases the number of pinholes, resulting in high leakage current and/or a low device yield. Prior dielectric layers generally needed to be coated at thicknesses of 400 nm to 500 nm to achieve a pinhole-free dielectric layer.

In fabricating the present dielectric structure, a dielectric composition is prepared which comprises a dielectric material and a low surface tension additive. The presence of the low surface tension additive reduces the pinhole density and increases device yield with a dielectric layer that is much thinner and has significantly lower surface roughness as well. The dielectric composition may also include a crosslinking agent, a thermal acid generator or a photo acid generator, and/or a solvent or a liquid.

In embodiments, any suitable insulating material can be used as the dielectric material. In further embodiments, the dielectric material is a thermally crosslinkable dielectric material. The term "thermally crosslinkable" refers to the fact that the dielectric material includes functional groups that can react with an additional crosslinking agent or with other functional groups in the dielectric material itself to form a crosslinked network upon heating. The dielectric material can comprise two or more different material having different dielectric constants. For example, the dielectric material can comprise a lower-k dielectric material and a higher-k dielectric material.

The terms "lower-k dielectric" and "higher-k dielectric" are used to differentiate two types of material (based on the dielectric constant) in the dielectric composition and in the phase-separated dielectric structure.

In embodiments, the lower-k dielectric material is electrically insulating and is compatible or has good compatibility with a semiconductor layer in the device. The terms "compatible" and "compatibility" refer to how well the semiconductor layer performs electrically when it is adjacent to or contacting a surface rich in the lower-k dielectric material.

In embodiments, the lower-k dielectric material has a hydrophobic surface and therefore may exhibit satisfactory to excellent compatibility with polythiophene semiconducting polymers. In embodiments, the lower-k dielectric material has a dielectric constant (permittivity) of for instance less than 4.0, or less than about 3.5, or particularly less than about 3.0. The lower-k dielectric material may have non-polar or weak polar groups such as a methyl group, phenylene group, ethylene group, Si—C, Si—O—Si, and the like. In particular embodiments, the lower-k dielectric material is a polymer. Representative lower-k dielectric polymers include but are not limited to homopolymers such as polystyrene, poly(4-methylstyrene), poly(chlorostyrene), poly(a-methylstyrene), polysiloxane such as poly(dimethyl siloxane) and poly(diphenyl siloxane), polysilsesquioxane such as poly(ethyl silsesquioxane), poly(methyl silsesquioxane), and poly(phenyl silsesquioxane), polyphenylene, poly(1,3-butadiene), poly($\alpha$-vinylnaphthalene), polypropylene, polyisoprene, polyisobutylene, polyethylene, poly(4-methyl-1-pentene), poly(p-xylene), poly(cyclohexyl methacrylate), poly(propylmethacrylPOSS-co-methylmethacrylate), poly(propylmethacrylPOSS-co-styrene), poly(styrylPOSS-co-styrene), poly(vinyl cinnamate), and the like. In specific embodiments, the lower-k dielectric polymer is a polysilsesquioxane, particularly poly(methyl silsesquioxane). The dielectric constant is measured at room temperature and at 1 kHz frequency. In other embodiments, the lower-k dielectric material is a molecular compound such as a molecular glass compound.

In embodiments, the surface of the lower-k dielectric polymer, when cast as a film, has a low surface energy. To characterize the surface energy, advancing water contact angle can be used. A high contact angle indicates a low surface energy. In embodiments, the contact angle is 80 degrees or higher, or higher than about 90 degrees, or particularly higher than about 95 degrees.

In embodiments, the higher-k dielectric material is electrically insulating and contains polar groups such as a hydroxyl group, amino group, cyano group, nitro group, C=O group, and the like. In embodiments, the higher-k dielectric material has a dielectric constant of 4.0 or more, 5.0 or more, or particularly 6.0 or more. In particular embodiments, the higher-k dielectric material is a polymer. General types of higher-k dielectric polymers may include polyimide, polyester, polyether, polyacrylate, polyvinyl, polyketone, and polysulfone. Specific representative higher-k dielectric polymers include but are not limited to homopolymers such as poly(4-vinyl phenol) (PVP), poly(vinyl alcohol), and poly(2-hydroxylethyl methacrylate) (PHEMA), cyanoethylated poly(vinyl alcohol) (PVA), cyanoethylated cellulose, poly(vinylidene fluoride) (PVDF), poly(vinyl pyridine), copolymers thereof, and the like. In embodiments, the higher-k dielectric material is PVP, PVA, or PHEMA. In other embodiments, the higher-k dielectric material is a molecular compound such as a molecular glass compound.

In embodiments, the higher-k dielectric polymer, when cast as a film, has a high surface energy. In terms of advancing water contact angle, the angle is for instance lower than 80 degrees, or lower than about 60 degrees, or lower than about 50 degrees.

In embodiments, the difference in magnitude of the dielectric constant of the higher-k dielectric material versus the lower-k dielectric material is at least about 0.5, or at least about 1.0, or at least about 2.0, for example from about 0.5 to about 200.

In embodiments, the dielectric structure has an overall dielectric constant of more than about 4.0, or more than about 5.0, particularly more than about 6.0. The overall dielectric constant can be characterized with a metal/dielectric structure/metal capacitor. Particularly for thin-film transistor applications, a high overall dielectric constant is desirable in embodiments, so that the device can be operated at a relatively low voltage.

In specific embodiments, the dielectric material is a combination of a lower-k dielectric material and a higher-k dielectric material. The lower-k dielectric material is poly(methyl silsesquioxane) and the higher-k dielectric material is poly(vinylphenol)

Any suitable low surface tension additive may be used in the dielectric composition to form the dielectric layer. A low surface tension additive is an additive that is able to reduce the surface tension of the dielectric composition and/or the dielectric layer under dynamic and static conditions. This allows the dielectric composition/layer to obtain an optimal wetting and leveling effect. The low surface tension additive may be present in an amount of from about 0.0001 to about 3.0 wt % of the dielectric material, including from about 0.0001 to about 1.0 wt %. In some embodiment, the low surface tension additive does not participate in any crosslinking of the dielectric material. In other embodiments, the low surface tension additive can crosslink with the dielectric material as well, to maintain its presence in the dielectric layer. Some functional groups, such as hydroxyl or carboxylic groups, can be present in the low surface tension additive to enable the crosslinking of the low surface tension additive together with the dielectric material.

In embodiments, the low surface tension additive includes a hydroxyl, siloxane (—SiR$_2$O—), fluorocarbon, and/or acrylic functional group. In some embodiments, the low surface tension additive is a modified polysiloxane, a fluorocarbon modified polymer, or an acrylate copolymer. In particular embodiments, the low surface tension additive comprises a hydroxyl functional group and a siloxane functional group.

In some embodiments, the low surface tension additive is a modified polysiloxane. The modified polysiloxane may be a polyether modified acrylic functional polysiloxane, a polyether-polyester modified hydroxyl functional polysiloxane, or a polyacrylate modified hydroxyl functional polysiloxane. Exemplary low surface tension additives include SILCLEAN additives available from BYK. BYK-SILCLEAN 3700 is a hydroxyl-functional silicone modified polyacrylate in a methoxypropylacetate solvent. BYK-SILCLEAN 3710 is a polyether modified acryl functional polydimethylsiloxane. BYK-SILCLEAN 3720 is a polyether modified hydroxyl functional polydimethylsiloxane in a methoxypropanol solvent.

In other embodiments, the low surface tension additive is a fluorocarbon modified polymer, a small molecular fluorocarbon compound, a polymeric fluorocarbon compound, and the like. Exemplary fluorocarbon modified molecular or polymeric additives include a fluoroalkylcarboxylic acid, Efka®-3277, Efka®-3600, Efka®-3777, AFCONA-3037, AFCONA-3772, AFCONA-3777, AFCONA-3700, and the like.

In other embodiments, the low surface tension additive is an acrylate copolymer. Exemplary acrylate polymer or copolymer additives include Disparlon® additives from King Industries such as Disparlon® L-1984, Disparlon® LAP-10, Disparlon® LAP-20, and the like.

The low surface tension additive is different from the dielectric material used to form the dielectric layer. One way to distinguish the additive from the dielectric material is the concentration difference in the dielectric composition. As aforementioned, the additive is no more than 3.0 wt % of the dielectric material.

A crosslinking agent may be present in the dielectric composition. When the dielectric composition comprises two or more materials, such as a higher-k dielectric material and a lower-k dielectric material which can separate into two or more phases during curing, the crosslinking agent causes crosslinking to occur between the higher-k dielectric material and the lower-k dielectric material throughout the phases. Other materials can be added into the dielectric composition. Representative crosslinking agents include poly(melamine-co-formaldehyde) resin, oxazoline functional crosslinking agents, blocked polyisocyanates, certain diamine compounds, dithiol compounds, diisocyanates, and the like.

A thermal acid generator may also be present in the dielectric composition. The thermal acid generator generates an acid when heated, catalyzing the crosslinking of the dielectric material to form a crosslinked dielectric layer that has good mechanical and electrical properties. The thermal acid generator generally should also have a good shelf-life in the dielectric composition.

In particular embodiments, the thermal acid generator is a hydrocarbylsulfonic acid. The term "hydrocarbyl" refers to a radical containing hydrogen and carbon, and which may be substituted. Exemplary hydrocarbylsulfonic acids include dodecylbenzenesulfonic acid, p-toluenesulfonic acid, and alkylnaphthalenedisulfonic acid. The thermal acid generator may be an amine-blocked or amine-neutralized hydrocarbylsulfonic acid. Commercially available thermal acid generators include NACURE® 5225, NACURE® 2501, NACURE® 2107, and NACURE® 3483, all of which are available from King Industries. The thermal acid generator may be present in the dielectric layer, or in the dielectric composition, in the amount of about 0.001 to about 3 wt %, by weight of the dielectric layer or of the dielectric composition without the liquid, including from about 0.1 to about 2 wt %.

Alternatively, a photo acid generator may be present in the dielectric composition to catalyze the crosslinking of the dielectric material. A photo acid generator is a compound that generates acid when exposed to visible light. Exemplary photo acid generators include (4-chlorophenyl)diphenylsulfonium triflate, (4-iodophenyl)diphenylsulfonium triflate, (4-methoxyphenyl)diphenylsulfonium triflate, (4-phenoxyphenyl)diphenylsulfonium triflate, (4-tert-butylphenyl) diphenylsulfonium triflate, 2-(4-methoxystyryl)-4,6-bis (trichloromethyl)-1,3,5-triazine, bis(4-tert-butylphenyl) iodonium p-toluenesulfonate, bis(4-tert-butylphenyl) iodonium perfluoro-1-butanesulfonate, diphenyliodonium hexafluorophosphate, diphenyliodonium p-toluenesulfonate, N-hydroxy-5-norbornene-2,3-dicarboximide perfluoro-1-butanesulfonate, N-hydroxynaphthalimide triflate, triarylsulfonium hexafluorophosphate salts, triphenylsulfonium perfluoro-1-butanesulfonate, tris(4-tert-butylphenyl)sulfonium perfluoro-1-butanesulfonate, and the like.

One, two or more suitable fluids can be used for the liquid (which facilitates the liquid depositing) or solvent which is used in the dielectric composition. In embodiments, the liquid/solvent is capable of dissolving the lower-k dielectric polymer and the higher-k dielectric polymer. Representative liquids include but are not limited to water; alcohols such as methanol, ethanol, propanol, butanol, pentanol, hexanol, ethylene glycol, dowanol, and methoxyethanol; acetates such as ethyl acetate and propylene glycol monoethyl ether acetate; ketones such as methyl isobutyl ketone, methyl isoamyl ketone, acetone, methyl ethyl ketone, and methyl propyl ketone; ethers such as petroleum ether, tetrahydrofuran, and methyl t-butyl ether; hydrocarbons such as hexane, cyclohexane, cyclopentane, hexadecane, and iso-octane; aromatic hydrocarbons such as toluene, xylene, ethyl benzene, and mesitylene; chlorinated solvents such as chloroform, dichloromethane, dichloroethane, chlorobenzene, dichlorobenzene, and trichlorobenzene; and other solvents such as dimethyl sulfoxide, trifluoroacetic acid, acetonitrile, dimethyl formamide, dimethyl acetamide, pyridine, and n-methyl-alpha-pyrrolidinone. The liquid/solvent may be from about 0 to about 98 wt % of the dielectric composition, including from about 50 wt % to about 90 wt %.

Inorganic nanoparticles may also be optionally included to boost the overall dielectric constant of the dielectric layer. These nanoparticles do not react with the dielectric polymers, and are generally dispersed throughout the dielectric layer. The nanoparticles have a particle size of from about 3 nm to about 500 nm, or from about 3 nm to about 100 nm. Any suitable inorganic nanoparticles can be used. Exemplary nanoparticles include metal nanoparticles such as Au, Ag, Cu, Cr, Ni, Pt and Pd; metal oxide nanoparticles such as $Al_2O_3$, $TiO_2$, $ZrO_2$, $La_2O_3$, $Y_2O_3$, $Ta_2O_5$, $ZrSiO_4$, SrO, SiO, $SiO_2$, MgO, CaO, $HfSiO_4$, $BaTiO_3$, and $HfO_2$; and other inorganic nanoparticles such as ZnS and $Si_3N_4$. The addition of inorganic nanoparticles has several advantages. First, the dielectric constant of the overall gate dielectric layer can be increased. Second, when metal nanoparticles are added, the particles can function as electron traps to lower gate leakage of the gate dielectric layer.

The concentration of each of the above listed components when present in the dielectric composition varies from about 0.001 to about 99 percent by weight of the composition. The concentration of the lower-k dielectric material is for example from about 0.1 to about 30 percent by weight, or from about 1 to about 20 percent by weight. The concentration of the higher-k dielectric material is for example from about 0.1 to about 50 percent by weight, or from about 5 to about 30 percent by weight. The concentration of crosslinking agent will depend on the concentration of the dielectric polymers. The ratio of the crosslinking agent to the dielectric polymers is, for example, from about 1:99 to about 50:50, or from about 5:95 to about 30:70 by weight. The ratio of the catalyst to the dielectric polymers is for example from about 1:9999 to about 5:95, or from 1:999 to about 1:99 by weight. The inorganic nanoparticles can be for example from about 0.5 to about 30 percent by weight, or from about 1 to about 10 percent by weight.

In embodiments, the lower-k dielectric material and the higher-k dielectric material are not phase separated in the dielectric composition. The phrase "not phase separated" means that the lower-k dielectric material and the higher-k dielectric material are dissolved in the liquid. The term "dissolved" indicates total dissolution or partial dissolution of the lower-k dielectric material and the higher-k dielectric material in the liquid. The lower-k dielectric polymer, the higher-k dielectric polymer, and the liquid may be miscible to form a single phase over certain ranges of temperature, pressure, and composition. The temperature range is for example from 0 to 150° C., particularly at about room temperature. The pressure is generally about 1 atmosphere. In the dielectric composition prior to the liquid depositing, the lower-k dielectric material and the higher-k dielectric material can be present for example from about 0.1 to about 98 weight percent, or from about 0.5 to about 50 weight percent, based on the total weight of the lower-k dielectric polymer, the higher-k dielectric polymer, and the liquid. The ratio between the lower-k dielectric material to the higher-k dielectric material can be for example from about 1:99 to 99:1, or from about 5:95 to about 95:5, particularly from about 10:90 to about 40:60 (first recited value in each ratio represents the lower-k dielectric polymer).

In embodiments where the lower-k dielectric polymer, the higher-k dielectric material and the liquid are miscible to form a single phase (typically a clear solution) prior to the liquid depositing, the single phase can be confirmed by light scattering technique, or visually detected by human eyes without the assistance of any tools.

Prior to the liquid depositing, the dielectric composition may contain in embodiments aggregates of the lower-k dielectric material and/or higher-k dielectric polymer. These aggregates may be for example on a scale less than the wavelength of visible light, or less than 100 nm, particularly less than 50 nm. For purposes of the present disclosure, these aggregates, if present in the dielectric composition, are not considered the result of phase separation or phase-separated; moreover, these aggregates are not considered the "first phase" and/or the "second phase."

The dielectric composition is liquid deposited onto a substrate. Any suitable liquid depositing technique may be employed. In embodiments, the liquid depositing includes blanket coating such as spin coating, blade coating, rod coating, dip coating, and the like, and printing such as screen printing, ink jet printing, stamping, stencil printing, screen printing, gravure printing, flexography printing, and the like.

In embodiments, the liquid depositing can be accomplished in a single step. The term "single step" refers to liquid depositing both the first and the second dielectric materials at the same time from one dielectric composition. This is different from the process for fabricating a conventional dual-layer dielectric structure, wherein two different dielectric materials are liquid deposited separately from two different dielectric compositions. "Step" in "single step" is different from the term "pass". In embodiments, in order to increase thickness of the dielectric structure, more than 1 pass can be carried out during the single step deposition of the dielectric composition.

In fabricating the dielectric structure, the present process involves causing phase separation of the lower-k dielectric material and the higher-k dielectric material to form a dielectric structure comprising two phases. The term "causing" includes spontaneous occurrence of phase separation during liquid deposition when the liquid evaporates. The term "causing" also includes external assistance for facilitating the phase separation during and after the liquid deposition. The dielectric composition is heated to cure the dielectric composition, resulting in the formation of a dielectric layer.

The term "phase" in "first phase" and "second phase" means a domain or domains of material in which a property such as chemical composition is relatively uniform. Accordingly, the term "interphase" refers to an area between the first phase and the second phase in the phase-separated dielectric structure in which a gradient in composition exists. In embodiments, the dielectric structure comprises the sequence: the first phase, optional interphase, and the second phase.

In embodiments, the "phase-separated" nature of the present phase-separated dielectric structure is manifested by any of the following possible representative morphologies of the first phase and the second phase: (1) an interphase (in the form of a layer) present between the first phase (in the form of a layer) and the second phase (in the form of a layer); (2) one phase forms a plurality of "dots" in a continuous matrix of the other phase; (3) one phase forms a plurality of rod-shaped elements (e.g. cylinders) in a continuous matrix of the other phase; and (4) one phase is interpenetrating into the other phase to form bicontinuous domains. In embodiments, morphology (2), (3), or (4) may be present, but not (1).

The "phase-separated" nature of the present phase-separated dielectric structure regarding the morphology of the first phase and the second phase can be determined by various analyses such as for example the following: Scanning Electron Microscopy (SEM) and Atomic Force Microscopy (AFM) analysis of surface and cross-section of the dielectric structure; and Transmission Electron Microscopy (TEM) analysis of a cross-section of the dielectric structure. Other tools such as light scattering and X-ray (wide angle and small angle X-rays) scattering could also be used.

In embodiments, morphology (1) involving the interphase differs from a conventional dual-layer gate dielectric having an interfacial layer in that the interphase involves a gradient composition change; whereas the interfacial layer involves a discontinuous composition change, not a gradient composition change. In embodiments, another difference is that the present interphase is relatively thick, involving a thickness ranging from about 10 nm to about 50 nm, which typically is significantly larger than any interfacial layer found in a conventional dual-layer gate dielectric which may have a interfacial layer thickness of less than about 5 nm, particularly less than about 3 nm.

In embodiments, the lower-k dielectric material is a majority of the first phase, and the higher-k dielectric material is a majority of the second phase. Similarly, the higher-k dielectric material is a minority of the first phase, and the lower-k dielectric material is a minority of the second phase. The term "majority" means more than 50% by weight of the total weight of the lower-k dielectric material and the higher-k dielectric material in a phase of the phase-separated dielectric structure. The term "minority" means less than 50% by weight of the total weight of the lower-k dielectric material and the higher-k dielectric material in a phase of the phase-separated dielectric structure.

In embodiments, the lower-k dielectric material is in a higher concentration than the higher-k dielectric phase in a region of the dielectric structure closest to the semiconductor layer. Put another way, the first phase is closer to the semiconductor layer than the second phase.

The term "region" refers to a thin slice (parallel to the surface of the dielectric structure) of the phase-separated dielectric structure closest to the semiconductor layer. The region is examined to determine its concentration of the lower-k dielectric material and the higher-k dielectric polymer. In embodiments, the region contains a portion of or all of the first phase and optionally a portion of or all of the second phase. In embodiments, the optional interfacial layer may be present in the phase-separated dielectric structure and thus the region may include the interfacial layer as long as the region has a sufficient thickness to include a portion or all of the first phase and optionally a portion or all of the second phase. The region has any suitable thickness for use in an analytical technique such as for example from about 1 nm to about 100 nm, or from about 5 nm to about 100 nm, or particularly from about 5 nm to about 50 nm.

Various methods can be used to determine the concentration of the two dielectric polymers. For example, X-Ray Photoelectron Spectroscopy (XPS) can be used to analyze the concentration of each atom in the region. AFM could be used to determine domain size of different phases. TEM on a cross-section of the region could also be used to determine domain size of difference phases and concentration of each atom of different dielectric materials. In certain embodiments, the combination of different methods may be used. In case of significant variation in results from different methods, the results from TEM analysis is preferred.

In embodiments of the "region," the lower-k dielectric material is at a concentration for example ranging from about 60% to 100%, or from about 80% to 100%, and the higher-k dielectric material is at a concentration ranging from about 40% to 0%, or from about 20% to 0%. The concentration can be controlled by various factors such as the initial ratio of the lower-k dielectric material and the higher-k dielectric material in the dielectric composition, the concentration of the dielectric polymers in the dielectric composition, the miscibility of the dielectric polymers, the processing conditions such as the annealing time and annealing temperature.

In order to achieve phase separation, in embodiments, the lower-k dielectric material and higher-k dielectric material are intentionally chosen to be immiscible or partially miscible in solid state. The miscibility (capability of a mixture to form a single phase) of the two dielectric polymers can be predicted by looking at their interaction parameter, x. Generally speaking, a material is miscible with another material which is similar to it.

In embodiments, the phase-separated dielectric structure comprises a material blend. In embodiments, the phase-separated material blend is a binary blend. In other embodiments, the phase-separated material blend is a ternary blend or a quaternary blend when a third or a fourth dielectric material is added respectively. As used herein, the term "blend" merely indicates the presence of two or more polymers and does not imply the concentration or distribution of the lower-k dielectric material and the high-k dielectric material in the first phase and the second phase. Further aspects of the present disclosure relate to a thin-film transistor comprising a phase-separated, material blend gate dielectric.

In embodiments, the present phase-separated dielectric structure contains intentionally created pores (also referred to as voids and apertures) such as those created using processes and materials similar to those described in for example Lopatin et al., U.S. Pat. No. 6,528,409; Foster et al., U.S. Pat. No. 6,706,464; and Carter et al., U.S. Pat. No. 5,883,219. In other embodiments, the present phase-separated dielectric structure does not contain such intentionally created pores (but pinholes may be present in certain embodiments which are not intentionally created but rather are an undesired byproduct of the present process). The pinhole density in embodiments is for example less than 50 per $mm^2$ (square millimeter), or less than 10 per $mm^2$, or less than 5 per $mm^2$, or less than 2 per $mm^2$. In further embodiments, the present dielectric structure is substantially pinhole free (i.e. less than 10 per $mm^2$ or less than 5 per $mm^2$). The pinholes can be identified by various techniques, such as Atomic Force Microscopy. In embodiments, there is absent a step to create pores in the dielectric structure.

The resulting dielectric layer may be thinner than those normally used in electronic devices. In embodiments, the dielectric layer has a thickness of from about 10 nm to about 1000 nm. In more specific embodiments, the dielectric layer has a thickness of from about 10 nm to about 500 nm. In some embodiments, the dielectric layer has a thickness of less than 300 nm.

The resulting dielectric layer also has a low surface roughness (i.e. high surface smoothness). The surface roughness is determined by the root mean square (rms) method. Briefly, the surface roughness is measured at several points on the layer. The reported surface roughness is the square root of the arithmetic mean (average) of the squares of the measured values. In embodiments, the dielectric layer has a surface roughness of less than 10 nanometers, including less than 5 nanometers.

An optional interfacial layer may be present between the semiconductor layer and the phase-separated dielectric structure. The interfacial layer may be prepared using the materials and procedures disclosed in for example U.S. Pat. No. 7,282,735, the disclosure of which is totally incorporated herein by reference.

The dielectric composition is typically cured by heating to form the dielectric layer. The present dielectric compositions can be thermally cured at temperatures of from about 80° C. to about 200° C. or from about 80° C. to about 140° C. The present dielectric compositions can be thermally cured for a period of from about 0.5 minutes to about 30 minutes or from about 0.5 minutes to about 5 minutes.

The dielectric layer of the present disclosure is thinner, smoother, and less susceptible to pinholes than conventional dielectric layers. This increases the yield of electronic devices using the dielectric layer to about 100%. In embodiments, the improvement of device yield is more than 50 percent, or more than 100 percent, or more than 200 percent, compared to devices having the dielectric layer where the low surface tension additive is absent.

Additional advantages may accrue when the dielectric composition includes the thermal acid generator and is used in conjunction with a flexible substrate. In roll-to-roll manufacturing, the substrate must be structurally flexible, such as a plastic like poly(ethylene terephthalate) (PET). As discussed above, after the dielectric composition is deposited on a substrate, the dielectric composition is cured by heating, forming a dielectric layer on the substrate. Normally, the dielectric composition is cured using a heat source, such as a hotplate or oven heating, to remove the liquid/solvent, and to cure the dielectric composition. Other heating methods include microwave, ultraviolet, and flash fusing. These heating methods typically heat all of the parts of the electronic device/transistor that are present on the substrate at the time the dielectric composition is applied. Due to the different construction of each part/layer, this application of heat can lead to deformation of, for example, the substrate. In addition, dielectric materials can require a relatively long curing time, such as 10 minutes or more. Thus, reducing the curing time is desirable. It is also desirable to reduce the processing temperature experienced by the substrate to avoid deformation of the substrate. Generally, the curing time can be shortened by increasing the curing temperature.

The inclusion of the thermal acid generator in the dielectric composition permits both a lowering of the curing time and a reduction in the processing temperature experienced by the substrate. Whereas prior dielectric compositions need to be thermally cured at temperatures of 140° C. to 160° C., the present dielectric compositions can be thermally cured at temperatures of from about 80° C. to about 120° C. Whereas prior dielectric compositions need to be cured for periods of about 30 minutes, the present dielectric compositions can be thermally cured for periods of from about 2 minutes to about 10 minutes. As desired, the dielectric composition can first be dried before initiating curing.

In specific embodiments, the dielectric layer is formed from a dielectric composition comprising poly(methyl silsesquioxane), poly(4-vinyl phenol), a crosslinking agent, and a low surface tension additive. This dielectric composition is deposited on a PET substrate.

Electrodes

The gate electrode can be a thin metal film, a conducting polymer film, a conducting film made from conducting ink or paste, or the substrate itself can be the gate electrode, for example heavily doped silicon. Examples of gate electrode materials include but are not restricted to aluminum, gold, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™, available from Acheson Colloids Company. The gate electrode layer can be prepared by vacuum evaporation, sputtering of metals or conductive metal oxides, coating from conducting polymer solutions or conducting inks by spin coating, casting or printing. The thickness of the gate electrode layer ranges for example from about 10 to about 200 nanometers for metal films and in the range of about 1 to about 10 micrometers for polymer conductors.

The source and drain electrode layers can be fabricated from materials which provide a low resistance ohmic contact to the semiconductor layer. Typical materials suitable for use as source and drain electrodes include those of the gate electrode materials such as gold, nickel, aluminum, platinum, conducting polymers and conducting inks. Typical thicknesses of source and drain electrodes are about, for example, from about 40 nanometers to about 10 micrometers with the more specific thickness being about 100 to about 400 nanometers.

Semiconductor Layer

Materials suitable for use as the organic semiconductor layer include acenes, such as anthracene, tetracene, pentacene, and substituted pentacenes, perylenes, fullerenes, phthalocyanines, oligothiophenes, polythiophenes, and substituted derivatives thereof. In embodiments, the organic semiconductor layer is formed from a liquid processable material. Examples of suitable semiconductor materials include polythiophenes, oligothiophenes, and the semiconductor polymers described in U.S. Pat. Nos. 6,621,099, 6,774, 393, 6,770,904, and 6,949,762, the disclosures of which are incorporated herein by reference in their entireties. Additionally, suitable materials include the semiconductor polymers disclosed in "Organic Thin-film transistors for Large Area Electronics" by C. D. Dimitrakopoulos and P. R. L. Malenfant, Adv. Mater., Vol. 12, No. 2, pp. 99-117 (2002), the disclosure of which is also incorporated herein by reference.

The semiconductor layer may be formed by any suitable means including but not limited to vacuum evaporation, spin coating, solution casting, dip coating, stencil/screen printing, flexography, gravure, offset printing, inkjet-printing, microcontact printing, a combination of these processes, and the like. In embodiments, the semiconductor layer is formed by a liquid deposition method. In embodiments, the semiconductor layer has a thickness of from about 10 nanometers to about 1 micrometer. In further embodiments, the organic semiconductor layer has a thickness of from about 30 to about 150 nanometers. In other embodiments, the semiconductor layer has a thickness of from about 40 to about 100 nanometers.

Gate Dielectric

The composition and formation of the gate dielectric are described herein. In embodiments, the dielectric is a highly crosslinked and robust layer comprising an infrared absorbing agent. In some embodiments, the dielectric is a homogeneous layer without phase separation. In other embodiments, the dielectric is a phase-separated gate dielectric, and the first phase and the second phase of the gate dielectric contact each other. In other embodiments, an interphase is present between the first phase and the second phase. In embodiments, the first phase of the gate dielectric contacts the semiconductor layer; in other embodiments, an interfacial layer is present between the first phase and the semiconductor layer. In embodiments, both the first phase and the second phase of the gate dielectric contact the semiconductor layer. In other embodiments, both the first phase and the second phase of the gate dielectric contact the semiconductor layer, wherein the contact area between the semiconductor layer and the first phase is larger than that between the semiconductor layer and the second phase in the channel region (the region between the source and drain electrodes) of the thin-film transistor.

The gate dielectric, the gate electrode, the semiconductor layer, the source electrode, and the drain electrode are formed in any sequence on the substrate. In embodiments, the gate electrode and the semiconductor layer are on opposite sides of the gate dielectric layer, and the source electrode and the drain electrode are both in contact with the semiconductor layer. The phrase "in any sequence" includes sequential and simultaneous formation. For example, the source electrode and the drain electrode can be formed simultaneously or sequentially. The composition, fabrication, and operation of field effect transistors are described in Bao et al., U.S. Pat. No. 6,107,117, the disclosure of which is totally incorporated herein by reference. The term "on the substrate" refers to the various layers and components with reference to the substrate as being the bottom or support for the layers and components which are on top of it. In other words, all of the components are on the substrate, even though they do not all directly contact the substrate. For example, both the dielectric layer and the semiconductor layer are on the substrate, even though one layer is closer to the substrate than the other layer.

The following examples are for purposes of further illustrating the present disclosure. The examples are merely illustrative and are not intended to limit devices made in accordance with the disclosure to the materials, conditions, or process parameters set forth therein. All parts are percentages by volume unless otherwise indicated.

EXAMPLES

Comparative Examples 1-3

Capacitors were made as follows. Poly(4-vinylphenol) (PVP, Aldrich, $M_w$=25,000) and melamine-formaldehyde resin (Aldrich, 84 wt % in n-butanol) were dissolved in n-butanol at a ratio of PVP to melamine-formaldehyde of 1:1 by weight. Poly(methyl silsesquioxane (PMSSQ) solution (~26 wt % in n-butanol) was added to the mixture. The resulting dielectric composition was filtered through a 0.2 μm syringe filter, then spin coated on an aluminum-coated glass substrate at 2,000 rpm for 60 seconds. After being dried at 80° C. for approximately 5 minutes, the dielectric layer was cured at 120° C. for 10 minutes. The thickness of the dielectric layer was measured after curing. The dielectric layer was thoroughly washed with n-butanol and then the thickness was measured again. Surface roughness was also measured using a DEKTAK™ 6 surface profilometer. Aluminum electrodes were evaporated on top of the dielectric layer to form a capacitor. The capacitor yield was then measured.

In Comparative Example 1, the dielectric composition contained 6.5 wt % PVP.

In Comparative Example 2, the dielectric composition contained 4.6 wt % PVP.

In Comparative Example 3, the dielectric composition contained 3.5 wt % PVP.

Examples 1-3

Examples 1-3 were made similar to the Comparative Examples. However, the low surface tension additive SILCLEAN 3700 was also added to the solution (0.001 wt % of PVP) prior to filtering.

In Example 1, the dielectric composition contained 6.5 wt % PVP.

In Example 2, the dielectric composition contained 4.6 wt % PVP.

In Example 3, the dielectric composition contained 3.5 wt % PVP.

Results

Tables 1 and 2 summarize the results of the Examples and Comparative Examples. Table 1 shows the thickness of the dielectric layer with and without the addition of the low surface tension additive. The thickness of the dielectric layer was controlled by adjusting the amount of PVP in the dielectric composition. As the PVP concentration increased, so did the dielectric layer thickness. As seen in Table 1, the low surface tension additive did not have a detrimental effect on crosslinking of the dielectric, as no significant thickness reduction after washing was observed for the Examples

TABLE 1

| | Dielectric Layer Thickness | | | |
|---|---|---|---|---|
| | Comparative Examples | | Examples | |
| wt % PVP | Thickness Before Wash | Thickness After Wash | Thickness Before Wash | Thickness After Wash |
| 6.5 | 540 nm | 540 nm | — | — |
| 4.6 | 337 nm | 335 nm | 331 nm | 322 nm |
| 3.5 | 233 nm | 236 nm | 238 nm | 235 nm |

Table 2 shows the capacitor yield for capacitors having a dielectric layer without the low surface tension additive as compared to capacitors having a dielectric layer with the low surface tension additive at various layer thicknesses. For the Comparative Examples (no low surface tension additive), a decrease in layer thickness resulted in a significant decrease in capacitor yield. However, in the Examples (having a low surface tension additive), a decrease in layer thickness did not decrease the capacitor yield. At a layer thickness of 230 nm, the Examples still achieved 100% yield, while the Comparative Examples only achieved 20% yield. The Comparative Examples required a thickness of 540 nm to obtain a 100% yield; this is over 2× the thickness of the Examples at which 100% yield was obtained. This result showed that the addition of a small amount of low surface tension additive improved device yield.

TABLE 2

| | Capacitor Yield | |
|---|---|---|
| Thickness (nm) | Capacitor Yield of Comparative Examples (no low surface tension additive) | Capacitor Yield of Examples (low surface tension additive) |
| ~540 nm | 100% | — |
| ~330 nm | 60% | 100% |
| ~230 nm | 20% | 100% |

Figure 5:
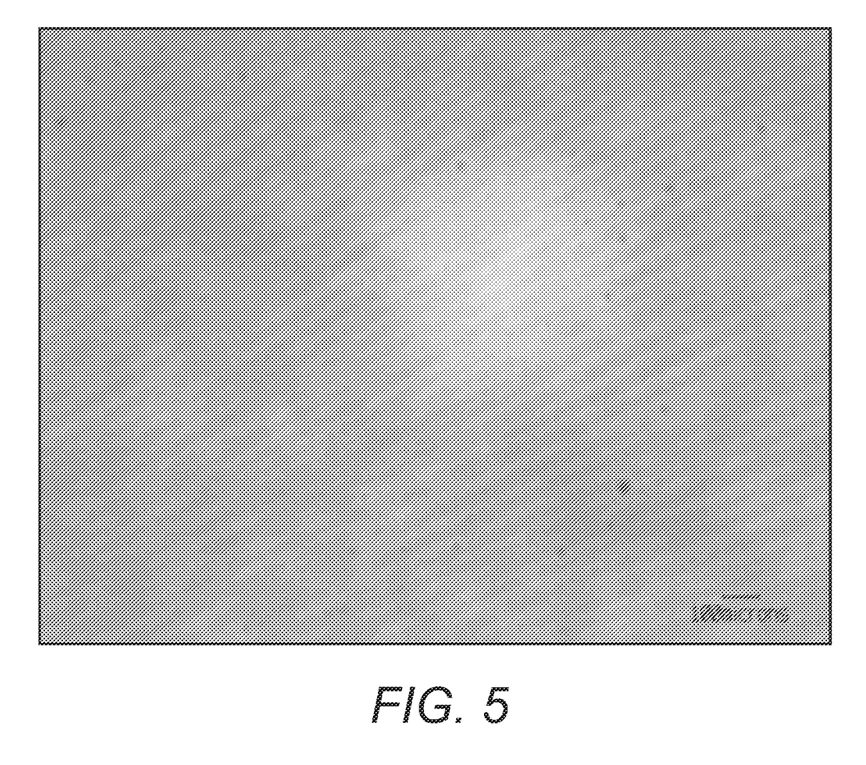
FIG. 5 is a photomicrograph of a comparative dielectric film.
Figure 6:
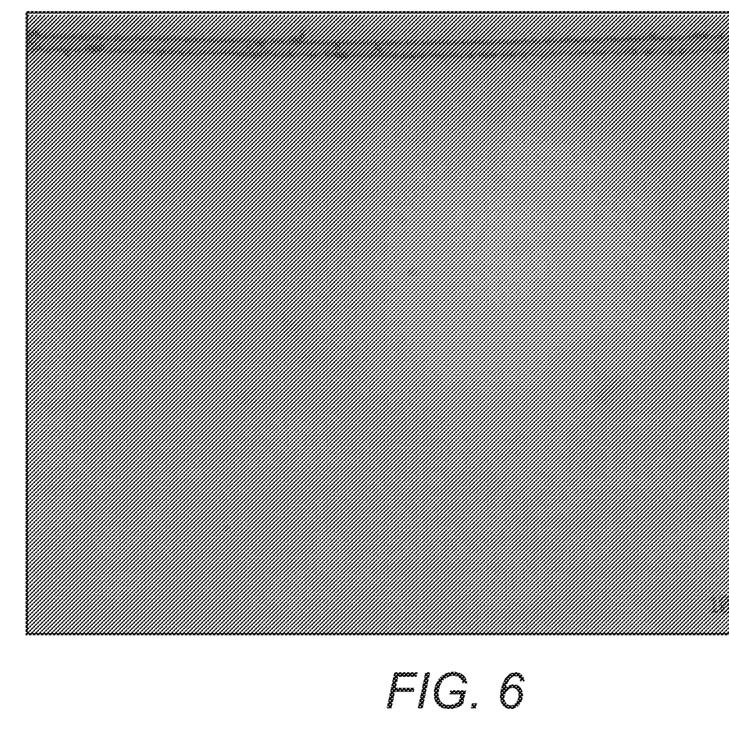
FIG. 6 is a photomicrograph of a dielectric film formed according to the present disclosure.

In addition, the surface roughness decreased. FIG. 5 is a photomicrograph of a dielectric film, 230 nm thick, formed without low surface tension additive. FIG. 6 is a photomicrograph of a dielectric film, 230 nm thick, formed with low surface tension additive. The surface roughness was measured at about 16 nm in FIG. 5, and the surface roughness was about 6 nm in FIG. 6. In FIG. 6, please note that a scratch on the film is shown running horizontally along the top of the photomicrograph.

Example 4

Thin-film transistors were fabricated on a poly(ethylene terephthalate) (PET) substrate with aluminum as the gate electrode. A gate dielectric layer (230 nm thickness) was formed on the aluminum gate electrode. Next, a polythiophene semiconductor layer was deposited on top of the dielectric layer by spin-coating at 1,000 rpm for 120 seconds, followed by annealing at 140° C. for 10 minutes in a vacuum oven. The polythiophene, known as PQT-12, has the following formula:

Gold source and drain electrodes were subsequently evaporated on top of the PQT-12 semiconductor to complete the device. Transistors with a channel length of 90 μm and a channel width of 1,000 μm were characterized with a Keithley SCS-4200 system.

Figure 7:
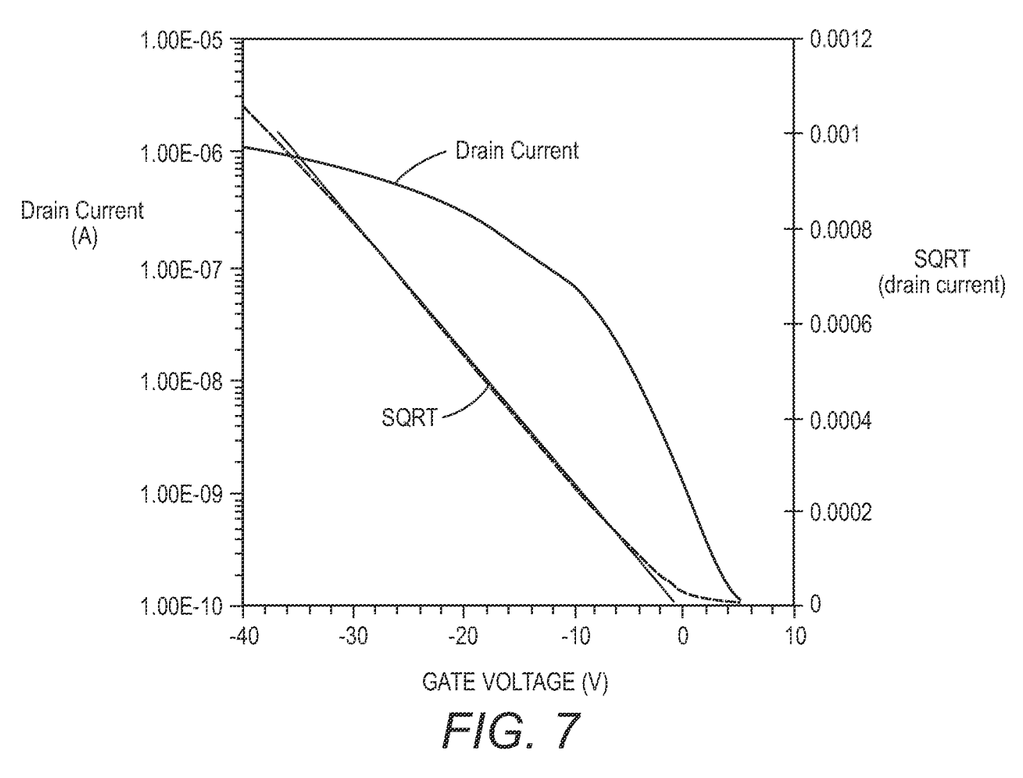
FIG. 7 is an I-V curve of a transistor having a dielectric layer of the present disclosure.

FIG. 7 shows the resulting transfer curve. The curved line is the drain current, while the dotted line is the square root of the drain current and a best fit line is shown for the square root of the drain current. The transistor showed mobility up to 0.06 cm²/V·sec, and a current on/off ratio of 10⁴. This performance is comparable to previous devices having a thicker dielectric layer, but the device of Example 4 exhibited a higher on current at the same gate bias.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

The invention claimed is:

1. A process for fabricating an electronic device having a dielectric layer on a substrate, comprising:
    depositing a dielectric composition on the substrate, the dielectric composition comprising a dielectric material and a low surface tension additive;
    optionally heating the dielectric composition, forming the dielectric layer on the substrate;
    wherein the low surface tension additive is a polyacrylate modified hydroxyl functional polysiloxane.

2. The process of claim 1, wherein the low surface tension additive is present in an amount of from about 0.0001 to about 3.0 wt % of the dielectric material.

3. The process of claim 1, wherein the dielectric composition further comprises a crosslinking agent.

4. The process of claim 1, wherein the dielectric material comprises a lower-k dielectric material and a higher-k dielectric material, wherein the lower-k dielectric material has a dielectric constant of less than 4.0 and wherein the higher-k dielectric material has a dielectric constant of 6.0 or more.

5. The process of claim 4, wherein the lower-k dielectric material is poly(methyl silsesquioxane); and
    the higher-k dielectric material is poly(4-vinylphenol).

6. The process of claim 1, wherein the dielectric composition further comprises a thermal acid generator or a photo acid generator.

7. The process of claim 1, wherein the dielectric layer is substantially free of pin holes.

8. The process of claim 1, wherein the dielectric layer has a thickness of from about 10 nm to about 1000 nm.

9. The process of claim 1, wherein the dielectric layer has a surface roughness of less than 10 nm.

* * * * *